United States Patent
Horn

(10) Patent No.: US 8,481,345 B1
(45) Date of Patent: Jul. 9, 2013

(54) METHOD TO DETERMINE THE POSITION-DEPENDANT METAL CORRECTION FACTOR FOR DOSE-RATE EQUIVALENT LASER TESTING OF SEMICONDUCTOR DEVICES

(75) Inventor: Kevin M. Horn, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 528 days.

(21) Appl. No.: 12/891,569

(22) Filed: Sep. 27, 2010

Related U.S. Application Data

(60) Provisional application No. 61/249,431, filed on Oct. 7, 2009.

(51) Int. Cl.
*H01L 21/00* (2006.01)
*G01R 31/00* (2006.01)

(52) U.S. Cl.
USPC ............... 438/16; 257/E21.521; 324/501

(58) Field of Classification Search
USPC ............... 438/16; 257/E21.521; 324/501
See application file for complete search history.

(56) References Cited

U.S. PATENT DOCUMENTS 5,430,305 A * 7/1995 Cole et al. ............ 250/559.07
5,667,300 A * 9/1997 Mandelis et al. ............ 374/43
7,019,311 B1 3/2006 Horn
7,375,332 B1 5/2008 Horn
2008/0077376 A1 * 3/2008 Belhaddad et al. ............ 703/13

OTHER PUBLICATIONS

D. Guidotti et al., "Spatially resolved defect mapping in semiconductors using laser-modulated thermoreflectance", Applied Physics Letters, vol. 47,(12), American Institute of Physics, Dec. 15, 1985, pp. 1336-1338.*
Koichi Ogawa et al., "Quantitative Image Reconstruction using Position-Dependent Scatter Correction in Single Photon Emission CT", IEEE, Nuclear Science Symposium, 1993, pp. 1011-1013.*
Horn, Laser Measurement Techniques for Detecting Age-Related Degradation of Device Radiation Response, IEEE CFP09RPS-CDR 47th Annual International Reliability Physics Symposium, Montreal, 2009.
Horn, Managing Age-related Change in Device Radiation-Response, Manuscript received Nov. 5, 2008. Work supported by US Department of Energy's NNSA under contract DE-AC04-94AL85000. Author is with Sandia National Laboratories, Albuquerque, NM.
Melinger, Pulsed laser-induced single event upset and charge collection measurements as a function of optical penetration depth, Journal of Applied Physics, vol. 84, No. 2, Jul. 15, 1998, 690-703.

* cited by examiner

*Primary Examiner* — William D Coleman
(74) *Attorney, Agent, or Firm* — Kevin W. Bieg

(57) ABSTRACT

A method reconstructs the charge collection from regions beneath opaque metallization of a semiconductor device, as determined from focused laser charge collection response images, and thereby derives a dose-rate dependent correction factor for subsequent broad-area, dose-rate equivalent, laser measurements. The position- and dose-rate dependencies of the charge-collection magnitude of the device are determined empirically and can be combined with a digital reconstruction methodology to derive an accurate metal-correction factor that permits subsequent absolute dose-rate response measurements to be derived from laser measurements alone. Broad-area laser dose-rate testing can thereby be used to accurately determine the peak transient current, dose-rate response of semiconductor devices to penetrating electron, gamma- and x-ray irradiation.

4 Claims, 10 Drawing Sheets

METHOD TO DETERMINE THE POSITION-DEPENDANT METAL CORRECTION FACTOR FOR DOSE-RATE EQUIVALENT LASER TESTING OF SEMICONDUCTOR DEVICES

CROSS-REFERENCE TO RELATED APPLICATION

This application claims the benefit of U.S. Provisional Application No. 61/249,431, filed Oct. 7, 2009, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to ionizing radiation effects in semiconductor devices and, in particular, to a method to determine the position-dependant metal correction factor for dose-rate equivalent laser testing of semiconductor devices. The method can improve the accuracy of laser-based techniques in determining the absolute peak transient current induced in semiconductor devices exposed to high energy transient ionizing radiation.

BACKGROUND OF THE INVENTION

Changes in the performance of semiconductor devices are a concern for systems with prolonged service lives that contain electronics that are not easily accessible for testing and replacement. Such effects are especially difficult to assess for devices that must be exposed to, and function in, transient ionizing radiation environments.

The use of infrared laser light to simulate the electrical effects of exposure to far more penetrating ionizing radiations, such as x-rays, gamma-rays, energetic electrons or single ions, is an established means of evaluating the localized radiation response of semiconductor devices. See J. S. Melinger et al., *J. Appl. Phys.* 84 (2), 690 (1998). Lower power, near-infrared bench-top exposure systems have been developed that track relative changes in semiconductor device dose-rate response based upon the fact that it is charge produced in the first few tens of microns of a silicon device that affects the electrically active regions of most modern semiconductor devices. See U.S. Pat. Nos. 7,019,311 and 7,375,332, which are incorporated herein by reference. In devices with moderately to heavily doped substrates, electron-hole pairs produced deeper in the device by more penetrating radiations, recombine before they can diffuse to near-surface circuit structures. Consequently, levels of charge generation comparable to that produced by far more penetrating radiation can be generated in the near-surface, electrically active regions of a device with low power near-infrared laser exposures.

In particular, laser dose-rate testing provides an efficient means to quantitatively track changes in the dose-rate response of semiconductor devices in systems with prolonged service lives. Accordingly, both focused and broad-beam, laser-based, dose-rate measurement techniques have been used to detect and track the relative changes in the dose-rate response of aging semiconductor devices. The purpose of the focused laser measurement system is to quantitatively and non-destructively document the position-dependent charge collection response of a semiconductor device (e.g., silicon device) to a specified radiation exposure. See U.S. Pat. No. 7,019,311. Using scanned, pulsed, focused, 904 nm laser exposures, the magnitude and time-delay of the peak charge collection across a device die is imaged with micrometer-resolution. Each laser pulse produces a concentration of electron-hole pairs within the electrically-active regions of the exposure area that is equivalent to a specified radiation environment. As the device die is rastered beneath the pulsed laser beam, the charge collection magnitude and time-delay measured at each exposure point is recorded to form quantitative, two-dimensional response images that can also be rendered as charge collection spectra (i.e., histograms) to create a response "signature" for the device. Device characterization with the focused laser system is complemented by a broad-area, pulsed, 904 nm laser exposure system that illuminates the full device die. See U.S. Pat. No. 7,375,332. The purpose of this system is to quantify and track the full die's functional response to ionizing radiation. The full die response can be recorded as a peak transient current, a change in the functional output of the device, or other performance parameter.

However, unlike x-rays, gamma-rays, or energetic electrons or ions, laser light is blocked from penetrating into near-surface regions where a device is overlain by opaque die metallization. This effect of shadowing by opaque metallizations is an inherent limitation in laser testing. Therefore, the usefulness of these laser techniques for making absolute measurements of a device's dose-rate response to a specified radiation environment has been limited by the fact that device die metallizations block the laser-illumination of the semiconductor material (e.g., silicon) that lies directly beneath the opaque metal, and thereby prevents the full replication of the charge generation effects that occur with more penetrating radiations. For example, the extent of this shadowing can be seen from the charge collection image of a 54LS14 integrated circuit shown in FIG. 1. FIG. 1(a) shows the position-dependent charge collection response of a portion of a 54LS14 die (corresponding to a single logic inverter among the six inverters fabricated in the die) as spatially imaged with a focused laser system. FIG. 1(b) shows the same region optically imaged with differential interference contrast microscopy. The outlines of distinct electrical diffusions are clearly visible in spite of the overlying metallizations. Diffused resistors 11 can be distinguished from arsenic electrical diffusions 14 and from unpatterned silicon 13 and other diffused regions 12 of the device.

In usual practice, dose-rate equivalent laser measurements are calibrated to electron or x-ray exposures by adjusting the intensity of the incident laser beam so as to produce the same measured peak transient current from the device as was measured during an electron or x-ray exposure of the same duration and known dose rate. Once the dose-rate response of a device has been qualified by traditional x-ray or linac-based tests, the laser-based measurements can be used to establish a baseline device response for relative comparison with subsequent laser measurements of an aging device. However, this calibration approach implicitly results in a higher density of charge generation in the exposed silicon regions of the device since no charge can be produced by the laser in the silicon covered by opaque metallizations. For example, if one-half of the surface area of a simple PIN diode were covered by opaque metallization, the incident laser would need to generate twice as much charge in the exposed silicon in order to attain the same overall peak transient current from the die as would be produced by an equivalent dose-rate exposure of electrons or x-rays that could penetrate through the metal. Thus, to the extent that an incident laser beam is blocked by opaque metallizations on the device die, the generation of charge is correspondingly reduced, and must be compensated for by either (a) increasing the incident laser intensity and thereby the corresponding charge generation within the exposed silicon, or (b) generating the same electron-hole pair density in the exposed silicon as would occur under electron or x-ray irradiation and then correcting the resulting measurement for the presence of occluded silicon areas.

However, the correction for the "missing" charge generation is not a simple multiplicative factor corresponding to the fractional area of metal coverage on the die; the correction factor must be weighted by the charge collection efficiency of the silicon lying beneath the metal. (In other words, metal that covers regions of low charge collection requires less "correction" than metal that covers regions of high charge collection.) As is visible in the micron-resolution, laser dose-rate response images shown in FIG. 1(a), charge collection can exhibit strong spatial dependence that must be factored into the metal-correction factor derivation.

Therefore, a need remains for a method to determine the position-dependant metal correction factor for dose-rate equivalent laser testing of semiconductor devices. Such a method would enable the determination of the absolute peak transient current response of a semiconductor device to ionizing radiation using bench-top laser diagnostic techniques.

SUMMARY OF THE INVENTION

The present invention is directed to a method to determine a position-dependant metal correction factor for dose-rate equivalent laser testing of semiconductor devices. The method enables the laser-based determination of the absolute peak transient current induced in a semiconductor device by a transient ionizing radiation pulse. The method uses micron-resolution charge-collection images produced by a focused laser irradiation apparatus to measure the position-dependent and dose-rate dependent charge collection magnitude across the unobstructed surfaces, for example silicon surface, of a semiconductor device die. By digitally extrapolating the position-dependent charge collection magnitude of partially exposed charge-collection regions into the occluded areas of the same circuit structure (typically an electrical diffusion that can be identified via differential interference contrast microscopy or other means of imaging by an analyst), a reconstructed image of the charge collection across the entire device die can be formed. A ratio of the total charge collection from the reconstructed image to that measured from the original "occluded" charge collection image, at each measured dose-rate, can then be used to determine the appropriate dose-rate dependent, metal-correction factor that should be applied to subsequent broad-area, dose-rate equivalent laser testing of the device. This, in turn, provides a means to arrive at an accurate absolute measurement of the device's peak transient current response to ionizing radiation using simple bench-top, laser-based diagnostic tools.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

The present invention is directed to a method that utilizes digital image reconstruction of the charge collection magnitude from regions beneath opaque metallizations, as determined from focused laser charge collection response images, and thereby derives a dose-rate dependent metal-correction factor with which to correct subsequent broad-area, dose-rate equivalent laser measurements. The metal-correction factor incorporates both the dose-rate dependence and the inherent position-dependent charge-collection efficiency of the semiconductor device and thereby permits absolute dose-rate response measurements to be derived from broad-beam laser tests alone. The method is generally applicable to any semiconductor device (e.g., silicon, germanium, or III-V semiconductor compounds), but will be described specifically as related to an exemplary silicon semiconductor device.

Figure 1:
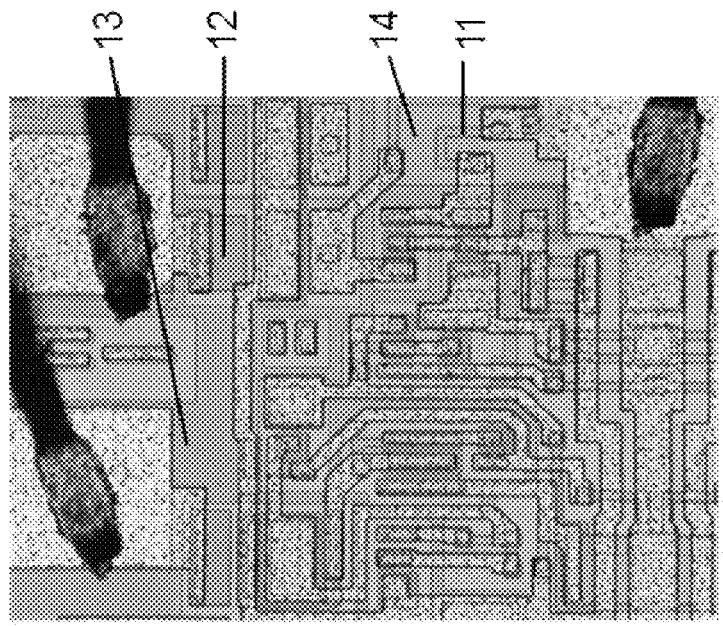
FIG. 1(a) is a charge collection magnitude image of a single inverter circuit within a 54LS14 integrated circuit.
FIG. 1(b) a differential interference contrast photomicrograph of the same region of the 54LS14 die.
Figure 1:
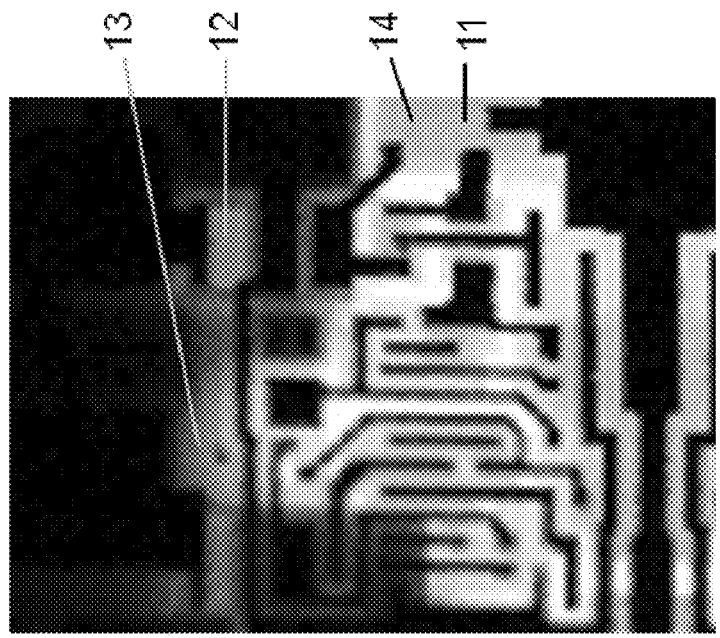
Figure 2:
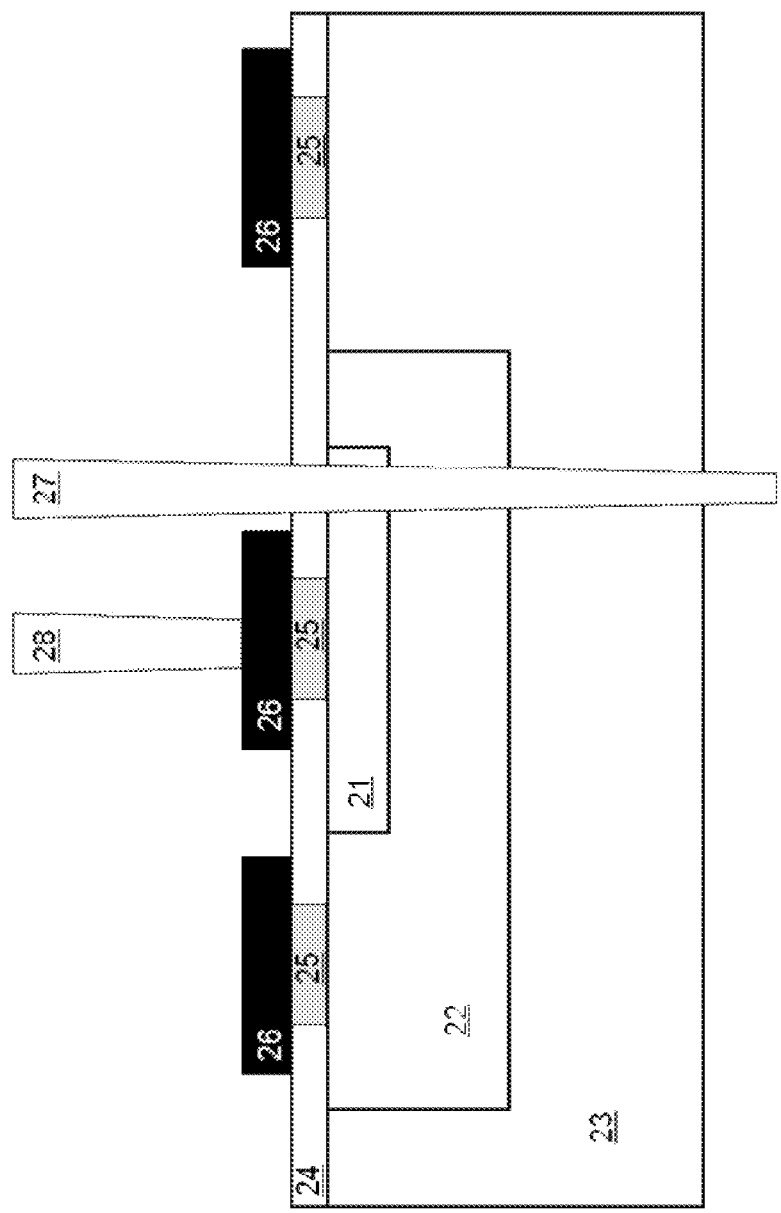
FIG. 2 is a schematic drawing of a representative cross-section of a simple, generic semiconductor device. The typical extent of electrical diffusions beneath and adjacent to opaque metal contacts and vias is shown, along with a metal-obstructed and unobstructed incident laser beam exposure.

FIG. 2 shows a simplified cross-sectional view of a generic, transistor-like structure comprising a doped semiconductor region 21 embedded within a second semiconductor region 22, of opposite doping to 21, which in turn is embedded within a third semiconductor region 23, of opposite doping to 22. All three doped semiconductor regions 21, 22, and 23 are covered by an insulating oxide 24 through which electrical contact is independently made to each doped semiconductor region by means of conducting vias 25 through the oxide that are also in electrical contact with the overlying device metallization lines 26.

The basis by which low power, infrared laser light can be used to simulate the electrical effects of higher energy, ionizing radiation is described in U.S. Pat. Nos. 7,019,311 and 7,375,332. Electrical charge (i.e., electron-hole pairs) that are created along the path of an incident laser beam 27 is separated and collected at semiconductor junctions by means of drift and diffusive charge transport processes and ultimately measured at device metallizations. However, when the incident laser beam 28 is blocked from entering the silicon of the device by overlying metallization layers 26, no electrical charge can be generated or collected.

If one considers a broad-area exposure of the device die as a combination of obstructed and unobstructed laser exposures, comparable to laser beams 28 and 27, respectively, only that portion 27 of the incident broad-area beam that is unobstructed will produce measurable charge. In usual practice, dose-rate equivalent laser measurements are calibrated to electron or x-ray exposures by adjusting the intensity of the broad-area, incident laser beam so as to produce the same measured peak transient current from the device as was measured during an electron or x-ray exposure of the same duration and known dose-rate. However, this calibration approach implicitly results in a higher density of charge generation in the exposed silicon regions of the device and still no charge generation in the silicon covered by opaque metallizations 26.

Figure 3:
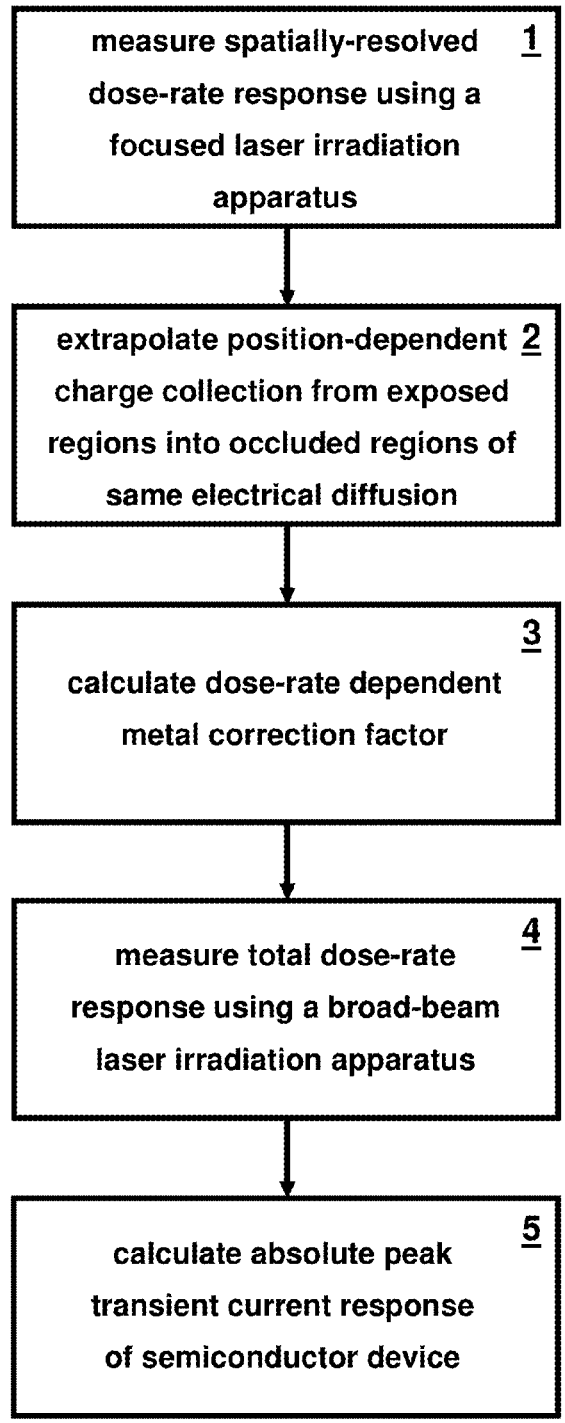
FIG. 3 is a flow diagram of a method to determine the position-dependant metal correction factor for dose-rate equivalent laser testing of a semiconductor device.

FIG. 3 shows a flow diagram of a method to determine the position-dependant metal correction factor for dose-rate equivalent laser testing of semiconductor devices. At step 1, a spatially-resolved dose-rate response of the semiconductor device is measured using a focused laser irradiation apparatus at a specified dose rate. For example, the focused laser irradiation apparatus can be similar to that described in U.S. Pat. No. 7,019,311. At step 2, the position-dependent charge collection magnitude from exposed regions of the measured die is extrapolated into occluded regions sharing the same electrical diffusion as the exposed region. At step 3, a dose-rate dependent metal correction factor can be calculated by first determining the total integrated charge collection measured from the occluded device's data image and, separately, from the digitally reconstructed data image (the term "data image" is used to reinforce the concept that the pixel values in each image provide not only a visual rendering of the relative charge collection magnitude across the die, but also retain the absolute charge collection value measured in Coulombs at each position). The total charge collection within each data image can be determined by summing, or integrating, the pixel values of the occluded and reconstructed images, respectively. Equivalently, the summation can be performed over the charge collection histograms of the respective data images. The quotient obtained by dividing the total integrated charge of the reconstructed data image by that of the as-measured occluded data image represents a multiplicative correction factor that accounts for both the presence of opaque metallizations on the die and the variation in charge collection efficiency across the die. At step 4, the dose-rate response of the full semiconductor device can be measured using a broad-beam laser irradiation apparatus. For example, the broad-beam laser irradiation apparatus can be similar to that described in U.S. Pat. No. 7,375,332. Finally, at step 5, the broad-beam laser measurement of the die can be multiplied by the correction factor calculated in step 3, thereby compensating for the presence of opaque metal and providing a result comparable to that obtained with more penetrating x-ray or e-beam irradiation.

Below is described an example of the application of the method to the evaluation of the dose-rate response of a commercial bipolar junction transistor and subsequent validation to experiment.

Figure 4:
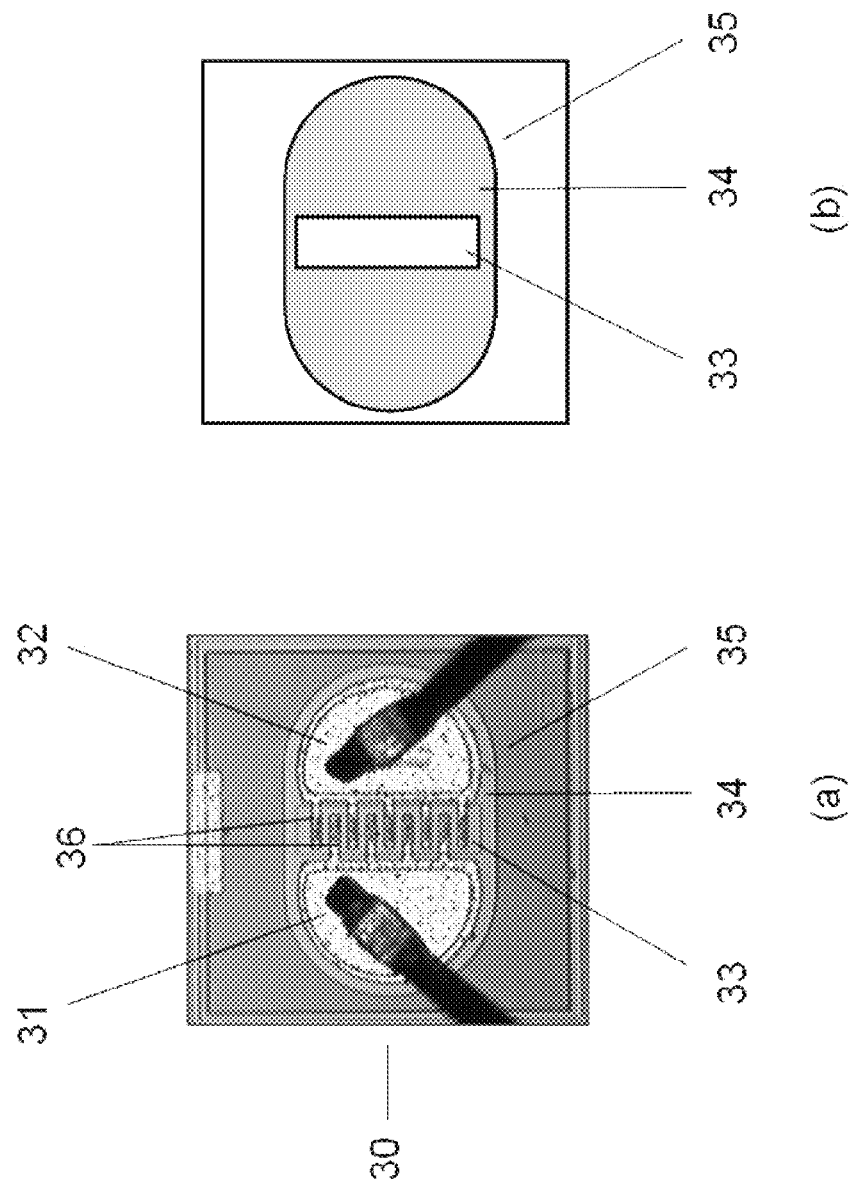
FIG. 4(a) is an optical photomicrograph of the surface of an SGH3992 bipolar junction transistor die.
FIG. 4(b) is a schematic illustration of the electrical diffusions of the collector, base and emitter regions of the same die.

FIG. 4 shows a simple device that provides a quantitative example of the invention. FIG. 4(*a*) is an optical photomicrograph of the surface of an SGH3992 bipolar junction transistor die 30. The electrical diffusions visible in the optical micrograph of the die are the collector 35, base 34, and emitter 33. A drawing of the boundaries of the electrical diffusions within the die is shown in FIG. 4(*b*). The bond wire landings for the base contact 31 and the emitter contact 32 of the transistor are visible as two large, opaque "D"-shaped metal areas on the die, each obscuring a significant portion of the base diffusion 34 from laser exposure. Actual electrical contact to the emitter 33 and base 34 diffusions of the die are made through vias beneath the interdigitated metal "fingers" 36 at the center of the die that extend from each of the D-shaped bond wire landings. These metal fingers 36 further obscure laser exposure of the emitter diffusion 33. Thus, the component pieces of the SGH3992's design can be identified through direct visible inspection, even in the presence of overlying metal layers. In cases of doubt, overlying metal layers can be chemically etched from the silicon surface, after laser measurements have been completed, and the occluded regions examined again with optical microscopy in order to reveal underlying design information relevant to image reconstruction.

Figure 5:
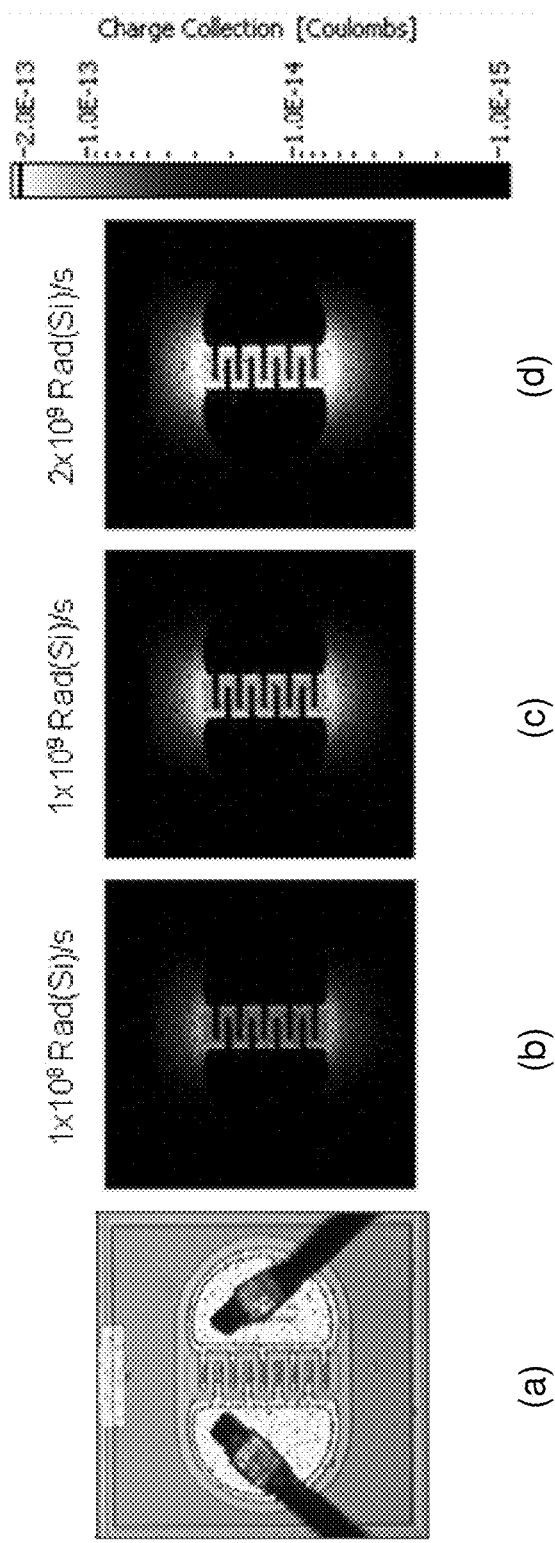
FIGS. 5(a-d) show as-measured, metal-occluded, micron-resolution charge-collection data images of the SGH3992 die for three distinct dose-rate equivalent laser intensities.

A spatially-resolved dose-rate response of the device can be measured using a focused laser irradiation apparatus at a specified dose rate. FIG. 5 shows the metal-obscured, dose-rate response images of the SGH3992 transistor (a) for equivalent dose-rates of (b) $1 \times 10^8$ rad(Si)/s, (c) $1 \times 10^9$ rad(Si)/s, and (d) $2 \times 10^9$ rad(Si)/s. These measurements were made with the focused laser irradiation apparatus described in U.S. Pat. No. 7,019,311 using a focused, 1 mW-delivered, 2-micron spot diameter, 50 ns wide, 904 nm laser pulse. All dose-rate response images are rendered using a common gray scale extending from 1 to 200 femtoCoulombs of charge collection. As is apparent from comparison of the optical micrograph of the transistor die, FIG. 5(*a*), with each of the dose-rate response images, FIGS. 5(*b-d*), the opaque metal bond landings 31, 32, and 36 effectively obscure the underlying silicon from laser interrogation. The selection of the dose-rates at which focused laser charge collection images are measured can be determined by either the design specifications of the ultimate application of the device, or by broad-area laser measurements, that may reveal non-linear response features that warrant detailed examination.

In comparing the three dose-rate response images, FIGS. 5(*b-d*), it should be noted that not only is there a strong position-dependence to the charge collection magnitude across the die, but that this dependence does not simply mirror the shape of the underlying base diffusion 34. Additionally, the strong dose-rate dependence of the charge collection response is not spatially uniform across the die (i.e., as the dose-rate increases, not all areas increase uniformly in collected charge). This is not intuitively obvious and is only revealed by the method of the present invention.

The micron-resolution imaging permits the charge collection response around and between obstructions to be directly inspected, and for devices with simple or known design layouts, the charge collection from a partially obstructed circuit structure can be deduced by extrapolation of the response from exposed regions. A dose-rate-dependent, metal-correction factor can be derived from the focused, laser does-rate response images, of the metal-occluded die by digitally extrapolating the position-dependent charge collection from exposed regions of each electrical diffusion into the occluded regions of the same electrical diffusion, as identified via optical microscopy, taking care to preserve the decreasing diffusive charge collection efficiency with distance.

Digital reconstruction of the occluded data image can be accomplished most simply by using a cut-and-past approach in which an analyst identifies regions that share common charge collection characteristics within the same electrical diffusion and then copies regions of pixels from unoccluded areas into adjacent occluded areas of the same diffusion. More sophisticated treatments can use digital image interpolation algorithms (such as used in image re-sizing, de-speckling, or other filtering processes). An example of a simple cut-and-paste software interface is shown in FIG. 6(a), along with several intermediate steps in the reconstruction process.

Figure 6:
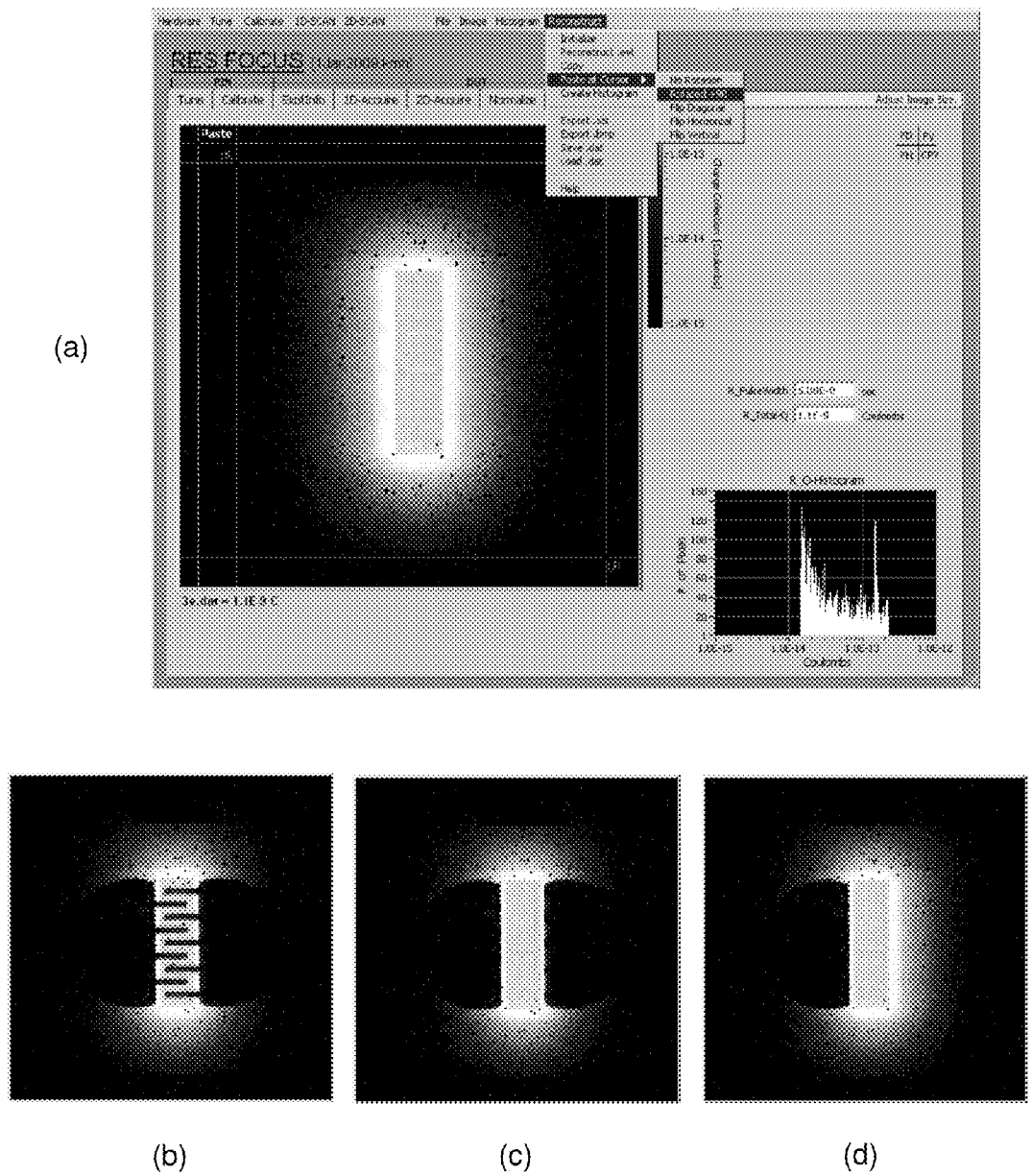
FIGS. 6(a-d) displays a simple software interface used to digitally reconstruct a full die charge collection image and three examples of intermediate stages of data image reconstruction.

Beginning with the as-measured, occluded image shown in FIG. 6(b), the analyst can first recognize that the charge collection visible between the interdigitated metal fingers 36 in the central emitter diffusion 33 is quite uniform. Since there is no physical or design reason to expect the charge collection characteristics beneath the metal to be different from those in the adjacent uncovered emitter region, the assumption is made that data-pixels from the un-occluded regions of the emitter are representative of those in the metal-occluded areas and can be copied into the adjacent occluded locations, resulting in the first step in the reconstruction shown in FIG. 6(c). In this instance, slight pixel-to-pixel measurement variations are preserved when copying a block of pixels from an un-occluded to an occluded region of the same diffusion. A more sophisticated software embodiment could make use of digital image interpolation concepts utilized to "Photoshop"-like applications that employ median-filtering or other statistical sampling techniques to ascribe pixel values.

The region of high charge collection at the left and right edges of the emitter diffusion 33 is reconstructed based on the unobstructed measurements present at the top and bottom edges of the emitter diffusion 33. This boundary of highest charge collection represents the prompt drift charge collection from the biased pn-junction depletion region at the emitter-base diffusion interface that extends around the entire emitter diffusion.

Extending out from the high charge collection perimeter of the emitter-base junction, a region of diffusive charge collection from the surrounding base diffusion can be seen in the as-measured occluded data-image. Again using the unobstructed regions extending vertically from the top and bottom of the emitter as a guide, the characteristic diffusion length of the lateral charge collection from the base diffusion is preserved and recreated in the metal-occluded regions of the base diffusion to the right of the emitter 32 by copying the thin un-occluded bands extending horizontally just above and below the opaque metal bond landings into the right-hand occluded base region, yielding the intermediate reconstruction shown in FIG. 6(d). A similar process is performed for the left-hand bond landing region, yielding the fully reconstructed image displayed in the software interface shown in FIG. 6(a). It can be noted that regions of diffusive charge collection are visible from both the surrounding base diffusion and the collector region surrounding the base. A histogram displaying the number of pixels as a function of their charge collection magnitude can be generated at any stage in the reconstruction process and is displayed in the lower right of the software interface.

Figure 7:
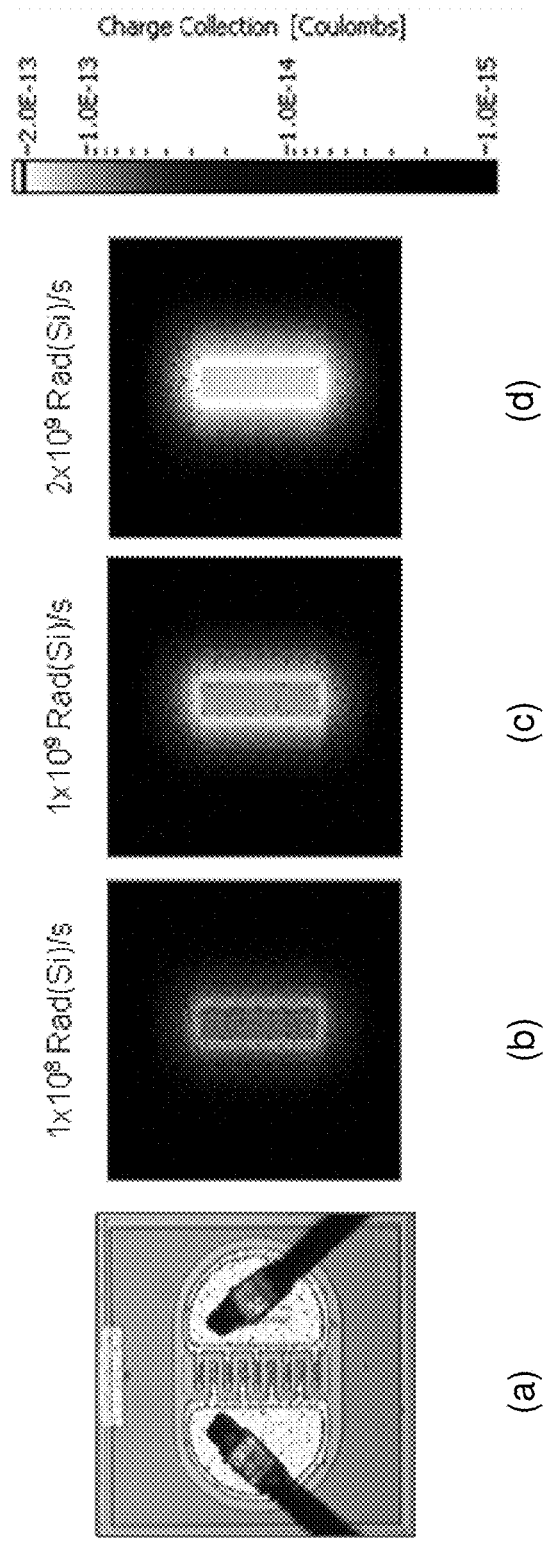
FIGS. 7(a-d) show the digitally reconstructed charge collection data images of the SGH3992 die for three dose-rate equivalent exposure conditions.

FIG. 7 shows the digital reconstructions of the dose-rate response images of the SGH3992 transistor (a) for equivalent dose-rates of (b) $1\times10^8$ rad(Si)/s, (c) $1\times10^9$ rad(Si)/s, and (d) $2\times10^9$ rad(Si)/s. Although the measured charge collection magnitudes are rendered as dose-rate response "images", the value of each pixel retains its original measured value (i.e., is not scaled to an integer, gray scale value). Consequently, histograms of the charge collection magnitude across the die can be formed for both the original and reconstructed data images and integrated to determine the total charge collection of each data image.

Figure 8:
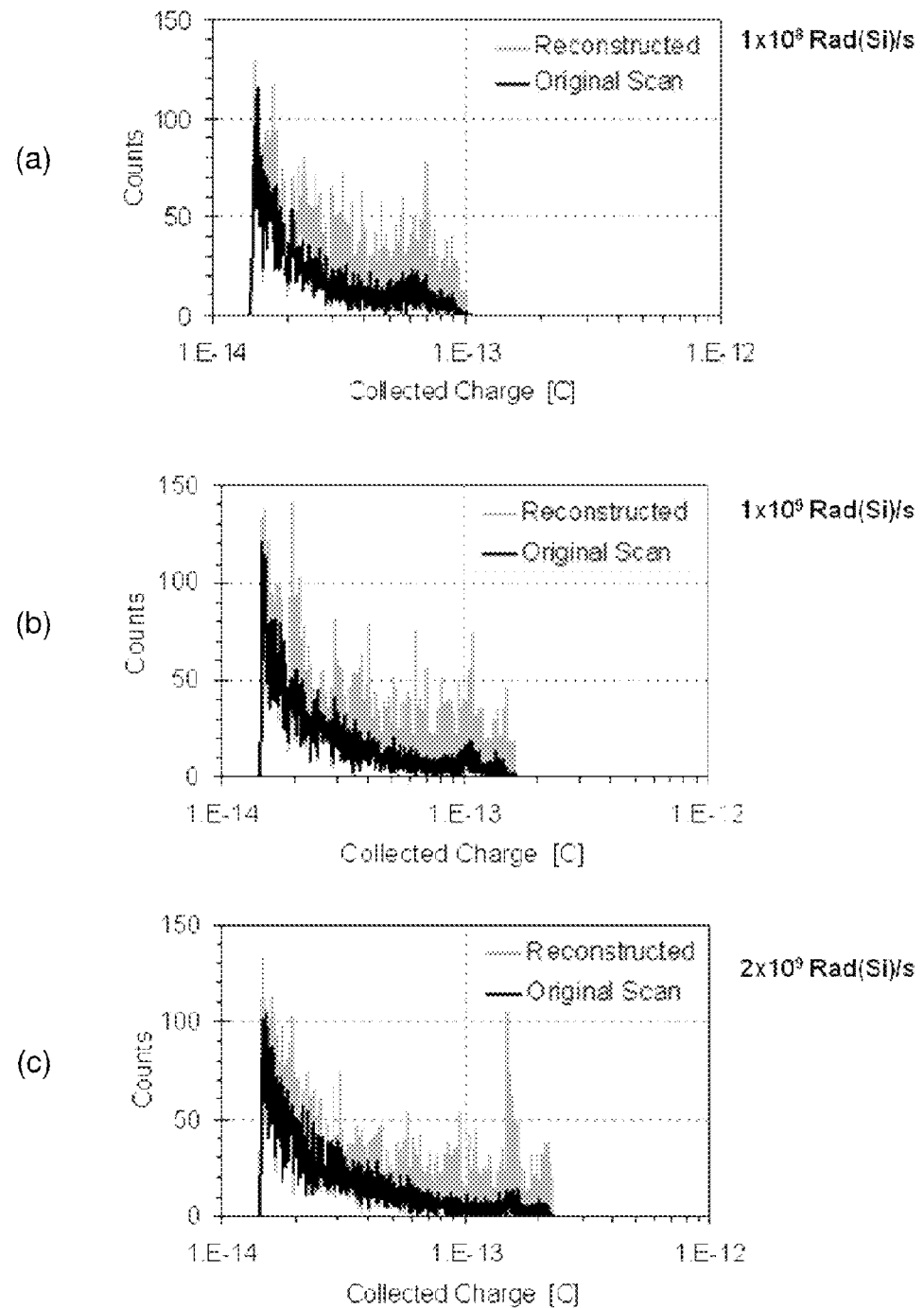
FIGS. 8(a-c) show the quantitative charge collection histograms derived from the as-measured and reconstructed charge collection images of the SGH3992 die for the three dose-rate equivalent exposure conditions.

FIG. 8 shows the charge collection histograms of the SGH3992 transistor for the measured equivalent dose-rates of (a) $1\times10^8$ rad(Si)/s, (b) $1\times10^9$ rad(Si)/s, and (c) $2\times10^9$ rad(Si)/s. Histogram spectra measured from the original 'occluded' die are plotted in black; histogram spectra of the digitally reconstructed die are plotted in gray. Comparing only the measured (black) spectra across the different dose-rates, it can be seen that the maximum charge collection increases from approximately 100 femtoCoulombs at $1\times10^8$ rad(Si)/s to over 200 femtoCoulombs at $2\times10^9$ rad(Si)/s. The reconstructed histogram spectra (gray) exhibit the same increase in maximum charge collection, but also reflect an overall increase in counts due to the reconstruction, and significant increases in the higher charge collection peaks resulting from the restoration of the prompt drift charge collection contributions from the biased pn-junction depletion region at the emitter-base diffusion interface.

A dose-rate dependent metal correction factor can be calculated by dividing the total integrated charge collected from the digitally reconstructed die at the specified dose rate by the total integrated charge of the as-measured occluded die at the same dose rate.

$$C(\dot{\gamma}) = \frac{Q_{Tot}^{Recon}(\dot{\gamma})}{Q_{Tot}^{Occl}(\dot{\gamma})}$$

At each dose-rate, the total charge collection, $Q_{Tot}$, measured from a die is simply the sum of the charge collection magnitude of all the individual pixels in the data image.

$$Q_{Tot}^{Die} = \sum_i q_i^{Die}(\dot{\gamma})$$

where $q_i^{Die}(\dot{\gamma})$ is the dose-rate dependent charge collection magnitude at each individual exposure point, or pixel. Equivalently, the charge collection histogram can be integrated to yield the same total charge collection value.

Figure 9:
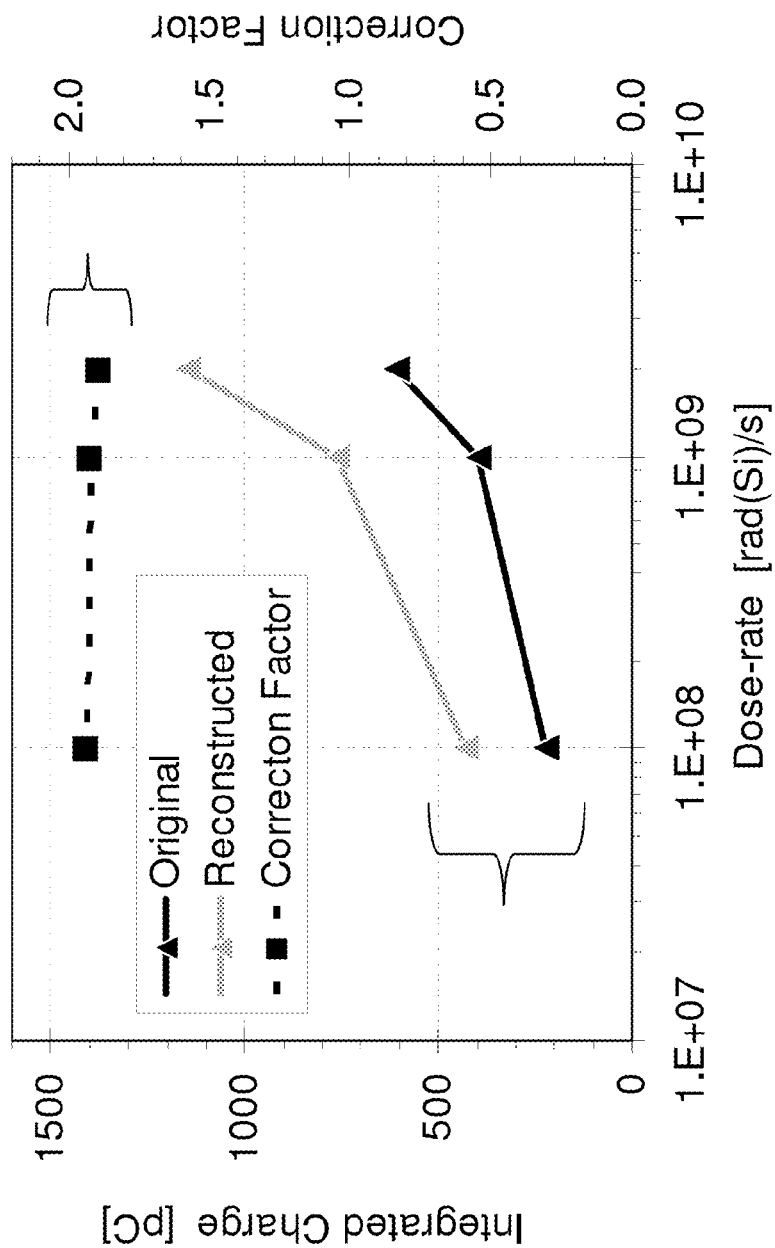
FIG. 9 shows the dose-rate dependent, charge-collection magnitude for the full die of the SGH3992 (plotted on the left-hand axis), as determined from numeric integration of the original and reconstructed laser dose-rate data images. The resulting dose-rate dependent, metal-correction factors are plotted against the right-hand y-axis.

FIG. 9 displays a plot of the total integrated charge from the as-measured, occluded die (black triangles) and the digitally reconstructed die (gray triangles), for the measurements made at $1\times10^8$ rad(Si)/s, $1\times10^9$ rad(Si)/s, and $2\times10^9$ rad(Si)/s. Both sets of data are plotted against the left hand y-axis.

The corresponding dose-rate-dependent metal-correction factor, $C(\dot{\gamma})$, is $$\frac{\sum Q_{Tot}^{Recon}(\dot{\gamma})}{\sum Q_{Tot}^{Occl}(\dot{\gamma})}$$

plotted with black square data points against the right-hand y-axis. Correction factors of 1.89, 1.92 and 1.94 were determined for the SGH3992 transistor at equivalent dose-rates of $1\times10^8$ rad(Si)/s, $1\times10^9$ rad(Si)/s, and $2\times10^9$ rad(Si)/s, respectively. Larger variations as a function of dose-rate have been seen in the calculation of correction factors for other part numbers.

Once the dose-rate dependent correction factor has been derived from the focused laser dose-rate data, it is applied to subsequent broad-area laser dose-rate tests in order to determine an absolute peak transient current response of the semiconductor device to ionizing radiation. The total dose-rate response of the device can be measured using a broad-beam laser irradiation apparatus. For example, the broad-beam laser irradiation apparatus can be similar to that described in U.S. Pat. No. 7,375,332. The absolute peak transient current response of the semiconductor device can then be calculated by multiplying the measured total charge collection from the entire die by the dose-rate dependant metal correction factor.

Figure 10:
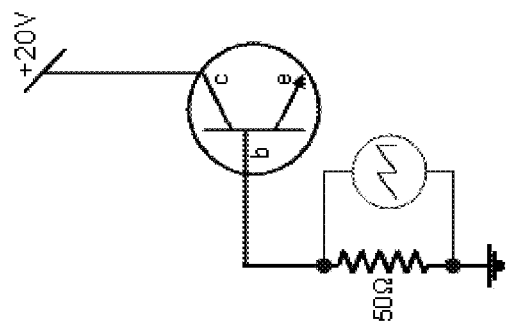
FIG. 10 shows a comparison of the peak transient current measured from six previously un-exposed SGH3992 transistors under 10 MeV, 1 µs electron exposure (plotted in gray) and the metal-corrected peak transient current measured from four previously un-exposed SGH3992 transistors under a dose-rate equivalent 904 nm, 1 µs laser exposure (plotted in black).
Figure 10:
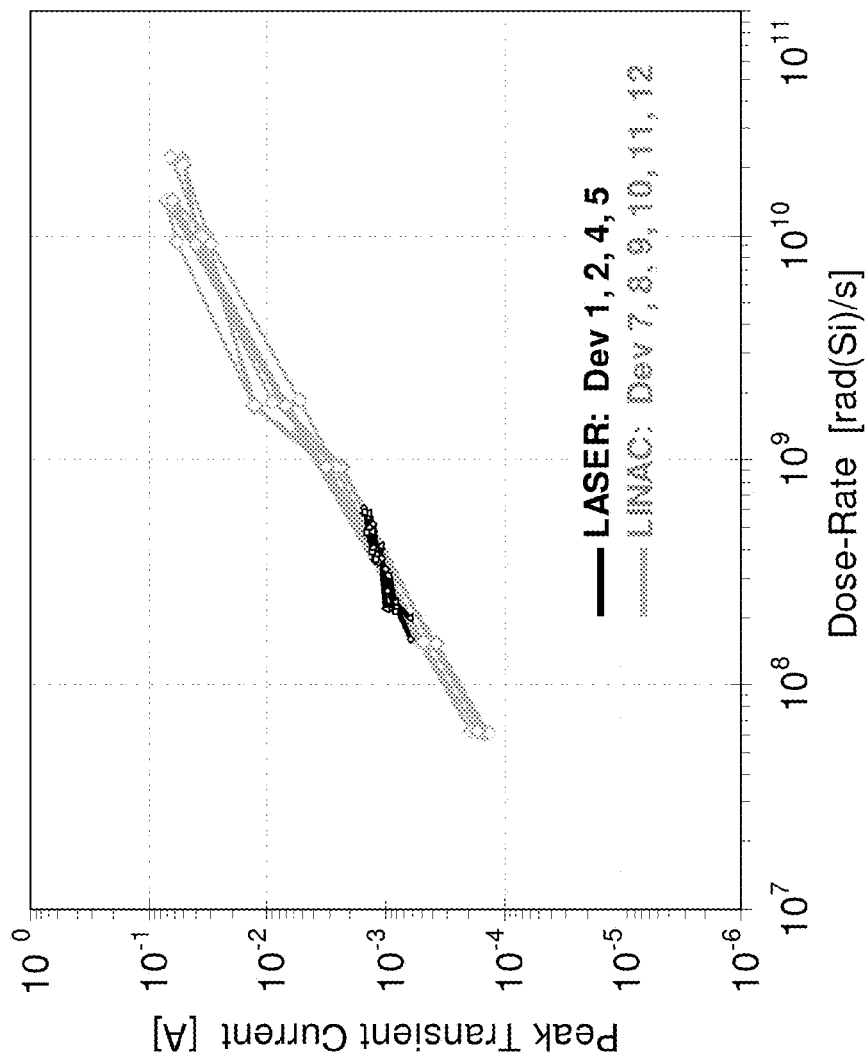

FIG. 10 shows a plot comparing the results from traditional electron beam LINAC tests (in gray) and equivalent broad-area laser, metal-corrected tests (in black). The LINAC tests were conducted using 1 microsecond pulse-width, 10 MeV electron beam exposures of six previously unexposed SGH3992 transistors. The laser tests were conducted using 1 microsecond pulse-width, 904 nm, dose-rate equivalent laser beam exposures of four previously unexposed SGH3992 transistors. The mid-point of the dose-rate range produced by the broad laser exposure is determined by choice of the separation distance between the target surface and the laser source. For a given target-laser separation, the lowest attainable dose-rate range is determined by the injection current threshold of the laser diode array; the highest attainable dose-rate is governed by the rated power limit of the selected laser diode array. In this example, a range of approximately $2\times10^8$ rad(Si)/s to $6\times10^8$ rad(Si)/s was sampled.

The test circuit used for both the electron beam and laser measurements biased the collector of the transistor at +20V, allowed the emitter to float, and measured the radiation-induced base current across a 50Ω impedance into a digitizing oscilloscope.

The peak transient currents measured from the dose-rate equivalent laser exposures were multiplied by the metal-correction factors derived above, and are plotted in black in FIG. 10. The metal-corrected laser dose-rate measurements of the peak transient current, (made on a laboratory bench-top), agree well with the corresponding 10 MeV electron beam measurements, made at a linear accelerator facility.

The present invention has been described as a method to determine the position-dependant metal correction factor for dose-rate equivalent laser testing of semiconductor devices. It will be understood that the above description is merely illustrative of the applications of the principles of the present invention, the scope of which is to be determined by the claims viewed in light of the specification. Other variants and modifications of the invention will be apparent to those of skill in the art.

I claim:

1. A method to determine a position-dependant metal correction factor for dose-rate equivalent laser testing of semiconductor devices, comprising:
    measuring a spatially-resolved dose-rate response of a semiconductor device using a focused laser irradiation apparatus at a specified dose rate; and
    extrapolating the position-dependent charge collection from exposed regions into occluded regions having the same electrical diffusion in the semiconductor device to provide the position-dependant metal correction factor.

2. The method of claim 1, further comprising:
    measuring the total integrated charge collected from the semiconductor device having occluded regions at the specified dose rate;
    calculating the total integrated charge from a digitally reconstructed, unoccluded semiconductor device at the specified dose rate;
    dividing the calculated total integrated charge collection from the unoccluded semiconductor device by the measured total integrated charge collected from the occluded semiconductor device to provide a dose-rate dependent metal correction factor;
    measuring the total dose-rate response of the semiconductor device using a broad-beam laser irradiation apparatus; and
    calculating the absolute peak transient current response of the semiconductor device by multiplying the broad-beam, laser-measured total dose rate response by the dose-rate dependent metal correction factor.

3. The method of claim 1, wherein the semiconductor device comprises silicon.

4. The method of claim 1, wherein the semiconductor device comprises germanium or an III-V semiconductor compound.

* * * * *